United States Patent [19]
Chesnoy et al.

[11] Patent Number: 5,655,040
[45] Date of Patent: Aug. 5, 1997

[54] METHOD OF FORMING A DISPERSING GRATING IN AN OPTICAL FIBER

[75] Inventors: José Chesnoy, Paris; Isabelle Riant; Pierre Sansonetti, both of Palaiseau, all of France

[73] Assignee: Alcatel N.V., Rijswijk, Netherlands

[21] Appl. No.: 572,717

[22] Filed: Dec. 14, 1995

[30] Foreign Application Priority Data

Dec. 15, 1994 [FR] France ............... 94 15132

[51] Int. Cl.$^6$ ............................................. G02B 6/34
[52] U.S. Cl. ................................................... 385/37
[58] Field of Search .............................. 385/31–37

[56] References Cited

FOREIGN PATENT DOCUMENTS

| | | |
|---|---|---|
| 382026B | 12/1986 | Austria . |
| 0606726A3 | 7/1994 | European Pat. Off. . |
| 2272075 | 5/1994 | United Kingdom . |
| WO9115787 | 10/1991 | WIPO . |
| WO9207289 | 4/1995 | WIPO . |
| 9207289 | 4/1995 | WIPO ............... 385/37 |

OTHER PUBLICATIONS

J.D. Prohaska et al, "Magnification of Mask Fabricated Fibre Bragg Gratings", *Electronics Letters*, vol. 29, No. 18, Sep. 2, 1993, Enage GB, pp. 1614–1615.

P.Y. Fonjallaz et al, "Direct determination of main fibre Bragg grating parameters using OLCR", *IEE Proceedings J. Optoelectronics*, vol. 141, No. 2, Apr. 1994, Stevenage GB, pp. 141–144.

S. J. Mihailov et al, "Recording of Efficient high–order Bragg reflectors in optical fibres by mask image projection and single pulse exposure with an excimer laser", *Electronics Letters*, vol. 30, No. 9, Apr. 28, 1994, Enage GB, pp. 707–709.

*Primary Examiner*—Akm E. Ullah
*Attorney, Agent, or Firm*—Sughrue, Mion, Zinn, Macpeak & Seas

[57] ABSTRACT

A laser source supplies a primary laser beam. A phase grating generates two secondary beams from the primary beam so as to form interference fringes that are inscribed in an optical fiber by photo-refraction. An optical system of variable focal length varies the gap between the interference fringes so as to vary the pitch of the Bragg grating discretely for successive segments of the optical fiber. Means displace the primary laser beam and the optical fiber relative to each other by successive segments of said fiber. These means are synchronized with the variation of the focal length of the optical system. Application to telecommunications.

7 Claims, 2 Drawing Sheets

METHOD OF FORMING A DISPERSING GRATING IN AN OPTICAL FIBER

The present invention relates to optical fiber technology, and in particular to a method of forming a dispersing grating in an optical fiber.

BACKGROUND OF THE INVENTION

In an optical fiber used for transmitting data, it is sometimes necessary to cause the refractive index of the optical fiber to vary periodically so as to use it as a reflector, in particular for obtaining a wide-spectrum filter for compensating high chromatic dispersion over a large spectrum band by means of the various spectrum components being reflected in staggered manner. Such index variation is achieved by inscribing a Bragg grating. This is done by irradiating the fiber with a system of interference fringes formed by two secondary ultraviolet beams coming from a common primary beam, and sloping symmetrically. The gap between the fringes defines the pitch of the grating.

There are several prior art solutions for obtaining a variable-pitch Bragg grating. A first solution consists in illuminating, with a parallel primary beam, a "phase grating" formed of parallel lines ruled in a transparent plate. The thicknesses of the lines are chosen so as to eliminate the diffracted beam of order 0. The beams of order +1 and −1 constitute the two secondary beams. Discrete variation in the pitch between successive segments of the phase grating causes corresponding variation in the pitch of the Bragg grating. Unfortunately, it is difficult to make the difference in pitch between two successive segments of the phase grating less than 1 nm. This difference is too great to make a filter having high chromatic dispersion, since it can be necessary in such a filter to obtain a pitch difference of less than $10^{-11}$ m, i.e. 0.1 angstroms.

Another prior art process consists in forming the two secondary beams from a parallel primary beam by means of two mirrors. De-collimating a secondary beam causes longitudinal variation in the pitch of the system of fringes. But the inscribed grating obtained by performing that process is too short, e.g. limiting the spectrum band of a chromatic dispersion compensator.

OBJECT AND BRIEF SUMMARY OF THE INVENTION

A particular object of the present invention is to make it possible to inscribe a Bragg grating that can be used effectively to compensate chromatic dispersion.

To this end, the invention provides a method of forming a dispersing grating in an optical fiber, which method includes the following steps:

forming a primary beam constituted by light suitable for inducing a photo-refractive effect in said optical fiber;

interposing on the path of said primary beam an optical system constituted by elements for splitting the beam into two secondary beams together forming a system of interference fringes having a pitch exhibiting a first pitch value;

exposing a first segment of said optical fiber to said system of interference fringes so as to inscribe a first elementary Bragg grating having said first pitch value;

changing the pitch by modifying said optical system so as to give said pitch a second value that is different from said first pitch value;

displacing said optical fiber over a length of said fiber relative to said secondary beams so as to make it possible to expose a second segment of the fiber to said system of interference fringes having said second pitch value; and exposing the second segment of the optical fiber to said system of interference fringes so as to inscribe therein a second elementary Bragg grating having said second pitch value;

wherein said change in pitch is obtained by means of a pitch-changing displacement whereby said elements of the optical system are displaced relative to one another, said relative displacement of the optical fiber being performed in such manner as to achieve phase coherence between said first and second elementary Bragg gratings.

BRIEF DESCRIPTION OF THE DRAWINGS

The objects, purposes and characteristics of the apparatus of the invention appear more clearly on reading the following description given with reference to the accompanying drawings, in which.

MORE DETAILED DESCRIPTION

Figure 1:
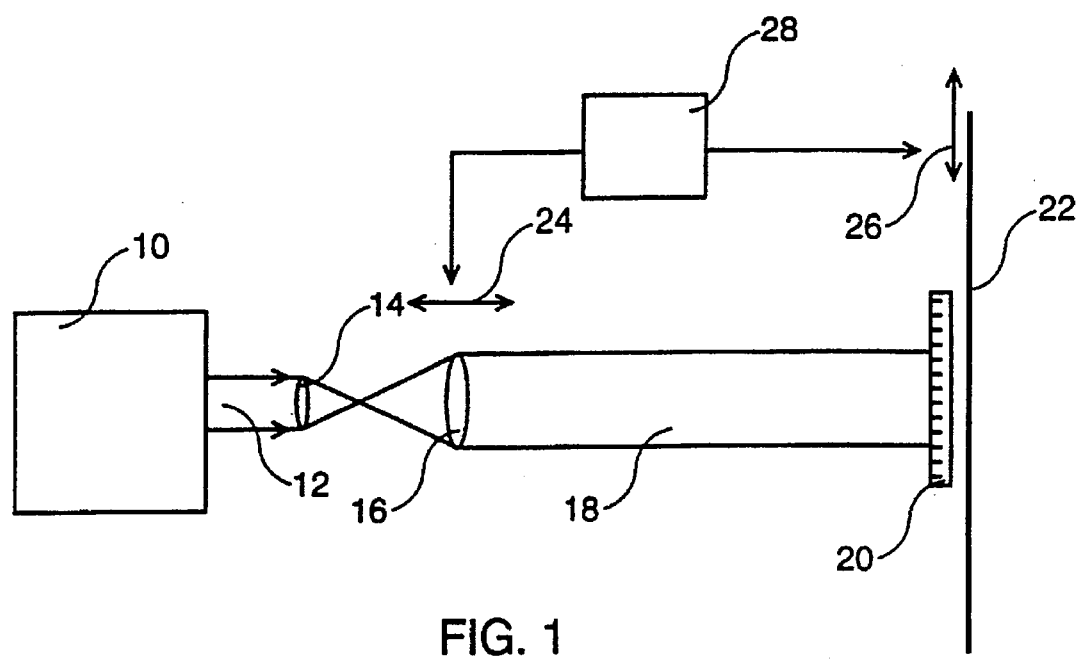
FIG. 1 is a diagram showing a first embodiment of the inscribing apparatus of the invention.

In a first embodiment of the apparatus of the invention shown in FIG. 1, a laser beam generator 10 supplies a laser beam (12) of ultraviolet light of wavelength $\lambda=240$ nm. The generator 10 may be of the type comprising a doubled dye laser pumped by an excimer laser, or of any other type.

The laser beam 12 then passes through an optical system formed by a first lens 14 and by a second lens 16. In such a system, which is initially afocal, the parallel beam 12 is focussed on the focal point of the first lens 14, which focal point is also the focal point of the second lens 16. As a result, the second lens 16 supplies a primary beam 18 that is parallel, i.e. that converges at infinity.

The primary beam 18 is then applied to a fixed-pitch phase grating 20 so as to generate interference fringes. The interference fringes (not shown) are inscribed in the optical fiber 22 by photo-refraction.

It should be noted that in the other dimension, i.e. the dimension perpendicular to the figure, the primary beam 18 is focussed on the fiber 22 by means of a cylindrical lens (not shown) whose curvature lies in the plane perpendicular to the figure. This focussing is intended to concentrate the light energy onto the optical fiber, and it is therefore independent of the afocal system formed by the lenses 14 and 16.

In the first embodiment, the focal length of the optical system formed by lenses 14 and 16 is caused to vary by displacing the lens 16 as indicated by arrow 24. The same effect may be obtained by displacing the lens 14. While the lens 16 is being displaced, the fiber is also displaced as indicated by arrow 26. Since the pitch of the Bragg grating inscribed in the optical fiber depends on the focal length of the optical system, the various pitches to be inscribed on the successive segments of the optical fiber are achieved by varying the focal length. The lens 16 (or the lens 14) and the optical fiber 22 are displaced under the control of a displacement control unit 28 in a synchronized manner. Thus, for a Given position of the lens 16 (or of the lens 14) and of the optical fiber 22, a Bragg grating of a given pitch is inscribed on a segment of the optical fiber. Then the displacement control unit 28 causes the lens 16 (or the lens 14) and the optical fiber 22 to be displaced concomitantly. The optical fiber is displaced very accurately so that a new segment, consecutive to the segment that has Just been inscribed, is ready to be inscribed. While the optical fiber is being displaced, the lens 16 (or the lens 14) is displaced so that, since its focal length is modified, the new segment of optical fiber is inscribed with the new pitch which is dependent on the new focal length of the optical system.

In the above-described embodiment, the phase grating must have a length not less than the length of a segment of the Bragg grating to be inscribed. However, the Bragg grating is not limited, and it depends on the length of optical fiber that is to be inscribed. In any event, this embodiment makes it possible to inscribe long lengths of fiber, and therefore to obtain a chromatic dispersion compensator having a large passband.

Figure 2:
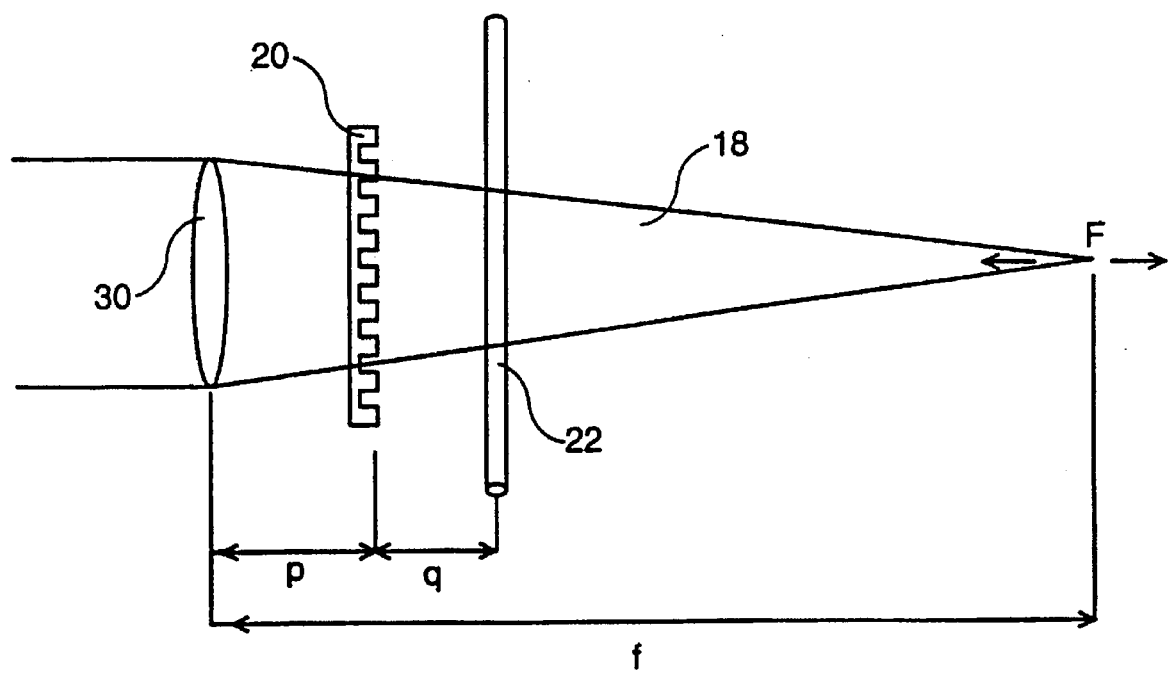
FIG. 2 is a diagram showing the optical system, the phase grating, and the optical fiber of the inscribing apparatus shown in FIG. 1.

When the lens of the optical system is displaced, the point of convergence F of the primary beam 18 is displaced as shown diagrammatically in FIG. 2. If E is the distance between the optical system represented by the lens 30 and the phase grating 20, where q is the distance between the phase grating 20 and the optical fiber 22, and where f is the focal length of the optical system, then the relative variation of the Bragg wavelength of the Bragg grating relative to collimated illumination (infinite focal length) is given by:

$$\Delta\lambda/\lambda = -q/(f-p)$$

Figure 3:
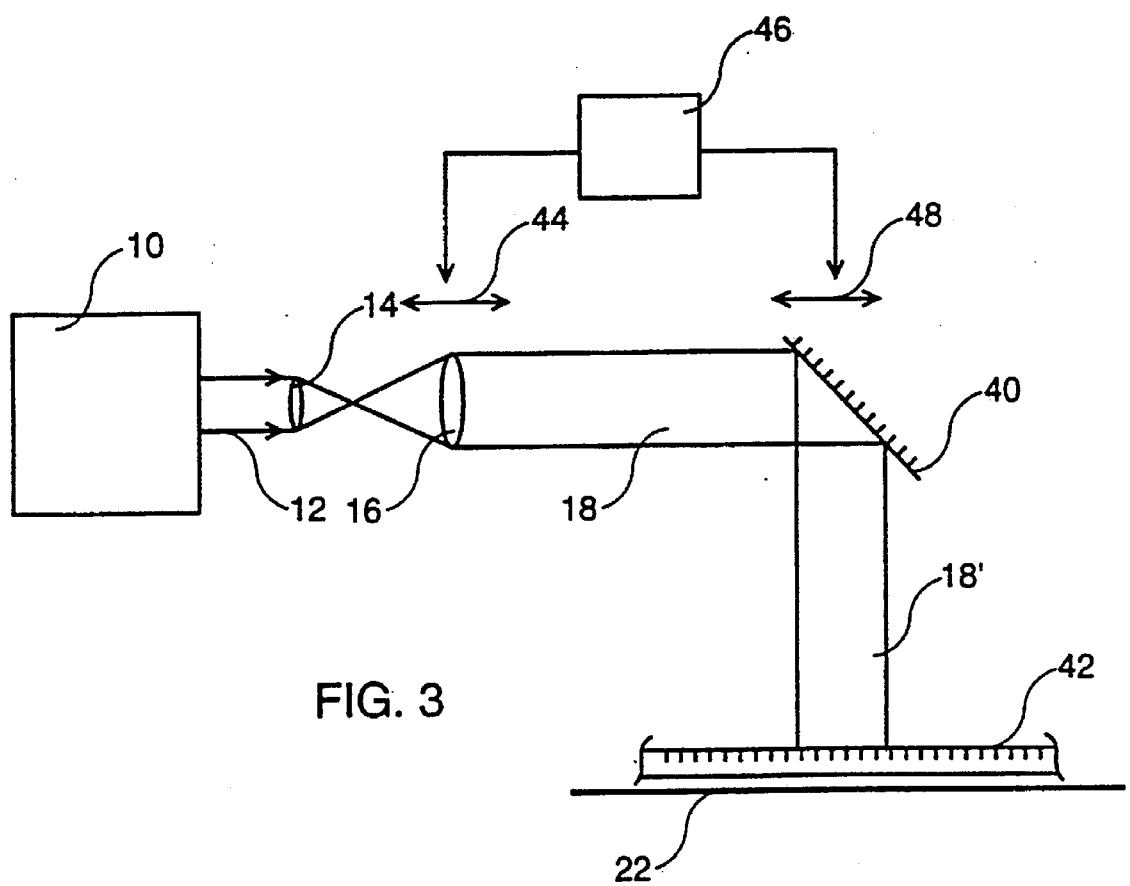
FIG. 3 is a diagram showing a second embodiment of the inscribing apparatus of the invention.

A second embodiment of the apparatus of the invention is shown in FIG. 3. In this embodiment, the laser beam 12 supplied by the generator 10 is transformed by the optical system constituted by the two lenses 14 and 16 so as to give the primary beam 18 in the same way as in the first embodiment shown in FIG. 1. But in this example, the primary beam 18 is reflected by a mirror 40 placed at 45° relative to the beam 18. The mirror 40 reflects the primary beam at 90° towards a phase mask or grating 42 contiguous to the optical fiber 22 to be inscribed.

Unlike the first embodiment, in the embodiment shown in FIG. 3, the phase grating and the optical fiber are static. But, at the same time as the displacement control unit 46 causes the lens 16 of the optical system to be displaced so as to cause the focal length to vary, it also causes the mirror 40 to be displaced in translation (as indicated by arrow 48) along the same displacement axis as the lens 16. The concomitant displacement of the mirror 40 and of the lens 16 is such that the reflected beam 18' is displaced onto the segment adjacent to the segment that has just been inscribed, while the lens 16 is displaced by a quantity necessary to obtain discrete variation of the pitch of the Bragg grating in compliance with the above-mentioned equation.

In the second embodiment, shown in FIG. 3, it is necessary for the phase grating to have a length not less than the length of the grating to be inscribed. That is why only a truncated portion of the phase grating is shown in the figure.

It should be noted that the second embodiment, shown in FIG. 3, makes it easy not only to juxtapose elementary gratings inscribed in the optical fiber, but also to obtain phase coherence between the gratings because the phase grating and the optical fiber remain static relative to each other. This result may also be obtained by using the embodiment shown in FIG. 1. In which case, the phase grating is as long as the optical fiber to be inscribed and is displaced longitudinally with the optical fiber.

Figure 4:
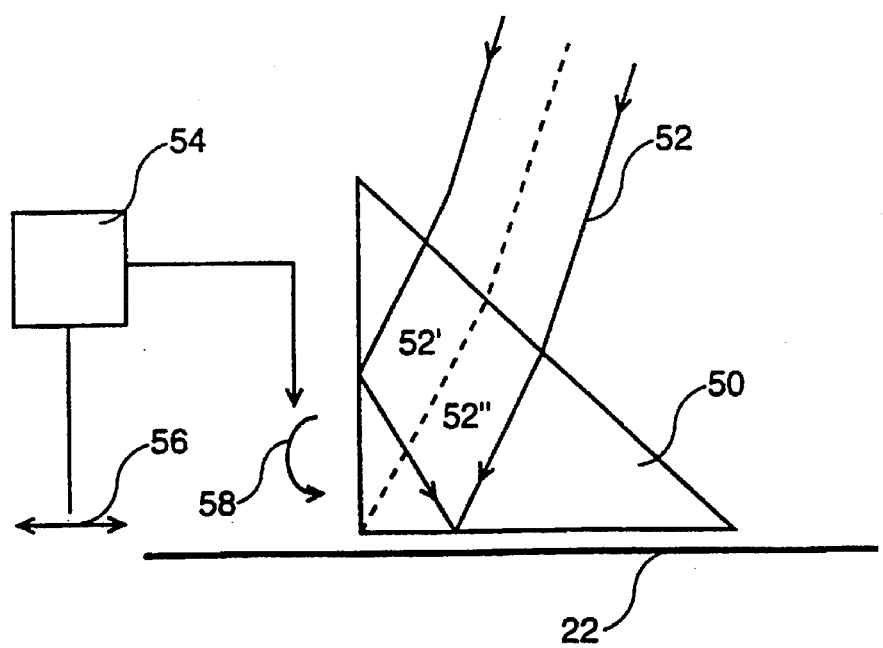
FIG. 4 is a diagram showing a third embodiment of the inscribing apparatus of the invention.

In a third embodiment shown in FIG. 4, the lens optical system is replaced with a prism 50. The incident primary beam 52 is refracted on entering the prism 50. As shown in the figure, the left portion 52' of the refracted beam is reflected by the inside edge of the prism, whereas the right portion 52" of the refracted beam is not reflected and arrives directly at the bottom edge of the prism. Thus, two secondary beams are formed, and, as a result, interference fringes are formed which serve to inscribe a Bragg grating in the optical fiber 22.

When a segment having a different pitch is to be inscribed, a displacement control unit 54 causes the optical fiber to be displaced longitudinally as indicated by arrow 56, and the prism to be rotated concomitantly as indicated by the curved arrow 58.

This rotation causes the angle of incidence of the beam 52 relative to the prism to vary, and therefore causes the slopes of the two secondary beams induced by the prism to vary. This (symmetrical) variation in the angles of the two secondary beams then results in a Bragg grating pitch that varies discretely from one segment to another along the optical fiber.

Although it is technically more difficult to achieve, the third embodiment may be simplified by retaining only the mirror (off which the left portion 52' of the beam is reflected) of the prism, and by rotating the mirror as indicated by arrow 58 so as to cause the pitch of the Bragg grating to vary as explained above.

Naturally, modifications may be made to the various embodiments of the inscribing apparatus without going beyond the ambit of the invention. The intensity of the inscribing beam at the optical fiber may be modulated step-wise, e.g. by displacing the cylindrical focussing lens over the optical fiber, so as that the resulting Bragg grating is subjected to apodization.

We claim:

1. A method of forming a dispersing grating in an optical fiber, which method includes the following steps:

forming a primary beam constituted by light suitable for inducing a photo-refractive effect in said optical fiber;

interposing on the path of said primary beam an optical system constituted by elements for splitting the beam into two secondary beams together forming a system of interference fringes having a pitch exhibiting a first pitch value;

exposing a first segment of said optical fiber to said system of interference fringes so as to inscribe a first elementary Bragg grating having said first pitch value;

changing the pitch by modifying said optical system so as to give said pitch a second value that is different from said first pitch value;

displacing said optical fiber over a length of said fiber relative to said secondary beams so as to make it possible to expose a second segment of the fiber to said system of interference fringes having said second pitch value; and exposing the second segment of the optical fiber to said system of interference fringes so as to inscribe therein a second elementary Bragg grating having said second pitch value;

wherein said change in pitch is obtained by means of a pitch-changing displacement whereby said elements of the optical system are displaced relative to one another, said relative displacement of the optical fiber being performed in such manner as to achieve phase coherence between said first and second elementary Bragg gratings.

2. A method according to claim 1, said optical system including, for each exposure of a segment of optical fiber, an optical-type auxiliary grating used for the exposure and receiving said primary beam so as to form said secondary beams;

wherein said auxiliary gratings used for said exposures of the first and second segments of the optical fiber are constituted by first and second segments of an overall auxiliary grating having a uniform pitch value, said elements of the optical system that are displaced by said pitch-changing displacement being constituted by elements acting on said primary beam upstream from the overall auxiliary grating, said relative displacement of the optical fiber also applying to the auxiliary grating as a whole so as to guarantee said phase coherence.

3. A method according to claim 2, said overall auxiliary grating being a phase grating, said pitch-changing displacement modifying convergence or divergence of said primary beam.

4. A method according to claim 1, wherein said optical system comprises at least two lenses.

5. A method according to claim 4, wherein said optical system includes a mirror for reflecting said primary beam.

6. A method according to claim 1, wherein said optical system comprises a prism.

7. An apparatus for forming a dispersing grating in an optical fiber, comprising:

means for forming a primary beam of light suitable for inducing a photo-refractive effect in said optical fiber;

an optical system interposed in the path of said primary beam for splitting said beam into two secondary beams which together form a system of interference fringes having a pitch exhibiting a first pitch value;

means for exposing a first segment of said optical fiber to said system of interference fringes so as to inscribe a first elementary Bragg grating having said first pitch value;

means for changing the pitch by modifying said optical system so as to give said pitch a second pitch value that is different from said first pitch value;

means for displacing said optical fiber over a length of said fiber relative to said secondary beams to expose a second segment of said optical fiber to said system of interference fringes having said second pitch value; and means for exposing said second segment of the optical fiber to said system of interference fringes so as to inscribe therein a second elementary Bragg grating having said second pitch value such that said first elementary Bragg grating and said second elementary Bragg grating are in phase coherence with each other.

* * * * *